(12) United States Patent
Kibar et al.

(10) Patent No.: US 6,194,950 B1
(45) Date of Patent: Feb. 27, 2001

(54) HIGH-SPEED CMOS MULTIPLEXER

(75) Inventors: Osman Kibar, San Diego, CA (US); Ashok V. Krishnamoorthy, Middletown, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/143,170

(22) Filed: Aug. 28, 1998

Related U.S. Application Data
(60) Provisional application No. 60/057,746, filed on Aug. 28, 1997.

(51) Int. Cl.[7] .................................................. H03K 17/62
(52) U.S. Cl. ............................................ 327/410; 327/407
(58) Field of Search ..................................... 327/115, 408, 327/407, 409, 410, 411, 412, 413; 333/57, 108 A; 370/280, 314, 916

(56) References Cited

U.S. PATENT DOCUMENTS

| | | | |
|---|---|---|---|
| 4,106,278 | * | 8/1978 | Yasuda ................................. 327/115 |
| 5,243,599 | * | 9/1993 | Barrett et al. ........................ 370/112 |
| 5,365,204 | * | 11/1994 | Angiulli et al. ....................... 331/57 |
| 5,726,990 | * | 3/1998 | Shimada et al. ..................... 370/536 |
| 5,912,591 | * | 6/1999 | Yamada ................................. 331/57 |
| 5,955,912 | * | 9/1999 | Ko ....................................... 327/410 |

* cited by examiner

Primary Examiner—Jeffrey Zweizig

(57) ABSTRACT

A four-to-one multiplexer circuit constructed purely in CMOS technology and fabricated using only pass-gates and inverters. The resulting multiplexer is simpler to fabricate and operates faster than known similarly fabricated and constructed CMOS multiplexers.

16 Claims, 3 Drawing Sheets

HIGH-SPEED CMOS MULTIPLEXER

RELATED APPLICATION

This application claims priority from U.S. Provisional Patent Application Ser. No. 60/057,746 filed on Aug. 28, 1997.

BACKGROUND OF THE INVENTION

1. Field of the Invention

The present invention relates to multiplexers and, more particularly, to a complementary metal-oxide semiconductor (CMOS) time-division multiplexer constructed using only one- and two-transistor inverters and pass-gates.

2. Description of the Related Art

Time-division multiplexers are crucial components in electronic systems, especially for the transmission of multiple data signals on a single data transmission line. Various time-division multiplexers have been designed and demonstrated in Si-Bipolar or Heterojunction Bipolar technologies that are capable of operation at frequencies in excess of tens of Gigabits per second (Gbps). However, it is desirable to implement all of the circuits of a given electronic system in a common technology platform to reduce overall system cost. Since integrated CMOS technology is a common choice for implementing low cost electronics, a fast multiplexer designed purely in CMOS technology is highly desirable. It is further desirable to construct an integrated CMOS multiplexer using a minimum number of transistors.

SUMMARY OF THE INVENTION

The present invention provides a four-to-one ("4:1") multiplexer circuit designed purely in CMOS and having a minimal number of transistor devices. In accordance with the present invention, a 4:1 CMOS multiplexer having an on-chip voltage controlled oscillator (VCO), frequency divider circuits, and two stages of two-to-one multiplexers is fabricated using only inverters and pass-gates. The resulting multiplexer is advantageously simpler and inexpensive to fabricate and operates faster than any known similarly fabricated and constructed CMOS multiplexer.

The inventive multiplexer may be constructed using 0.8 $\mu$m pitch linewidth or finer CMOS technology and is operable at speeds in excess of approximately 2 Gbps. The present invention may be particularly useful for high-speed data communications systems and devices and also for high-speed optoelectronic-VLSI systems that employ fast optical data transmission.

Other objects and features of the present invention will become apparent from the following detailed description considered in conjunction with the accompanying drawings. It is to be understood, however, that the drawings are designed solely for purposes of illustration and not as a definition of the limits of the invention.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

The present invention advantageously provides a novel and unobvious integrated circuit (IC) multiplexer comprised entirely of CMOS inverters and pass-gates and capable of operating at speeds in excess of approximately 2 Gigabits per second (Gbps). In accordance with the present invention it is accordingly now possible to provide a low-cost, lower-power, high-speed multiplexer IC by advantageously fabricating the IC entirely of integrated CMOS technology—specifically, using only inverters and pass-gates.

Figure 1:
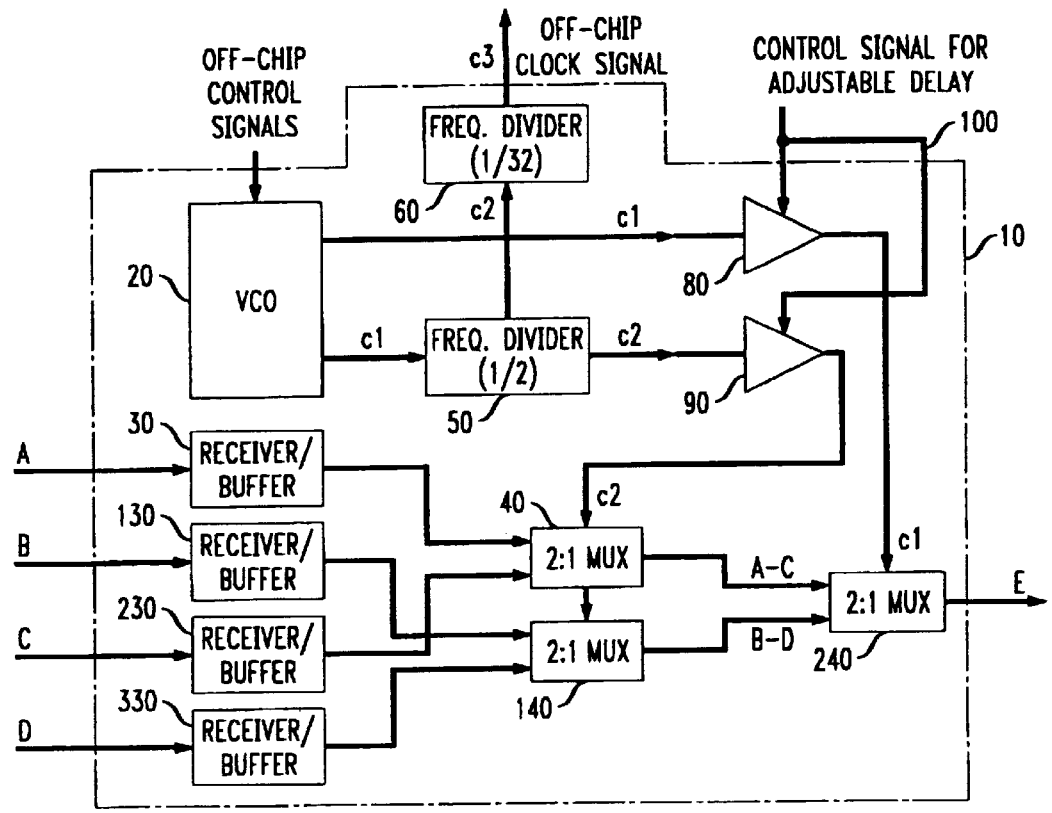
FIG. 1 is a block diagram of a four-to-one CMOS multiplexer constructed in accordance with the present invention.

Referring now to the drawings in detail, FIG. 1 depicts a block diagram of a fourto-one ("4:1") CMOS multiplexer IC 10 configured in accordance with the present invention. Although the drawings and following description are directed to a 4:1 multiplexer, i.e. a multiplexer having four inputs and one output, more or fewer inputs may alternatively be provided as a general matter of design choice so long as the sum of the input signal frequencies does not exceed the maximum operating frequency of the IC. The terms frequency and speed are used interchangeably herein to generally denote the rate at which digital data is communicated over or through a data transmission medium or device.

The inventive multiplexer 10 (FIG. 1) accepts four inputs A, B, C and D and produces a single output E that is the time-division multiplexed combination of the input signals. The multiplexer 10 includes a three-stage voltage controlled oscillator (VCO) 20 that generates a variable frequency on-chip clock signal cl. The frequency of clock cl is controlled by a DC voltage value provided by off-chip components and depends on the value of the input signal frequencies and on the number of inputs to the multiplexer 10. For the herein disclosed and preferred 4:1 multiplexer embodiment of the present invention, the frequency of clock c1 will be approximately four times the frequency of the individual input signals. Since the frequency of clock c1 depends directly on the number of inputs to the multiplexer 10, it will be obvious to a person skilled in the art that the frequency of clock cl for an 8:1 multiplexer configured in accordance with the present invention will be approximately eight times the input signal data speed, sixteen times the input signal data speed for a 16:1 multiplexer, and so on.

The VCO 20 is connected to a frequency divider 50 that halves the frequency of clock c1 to produce a second clock signal c2. The output of frequency divider 50 is connected to a buffer 90 and then to a first stage of two-to-one ("2:1") multiplexers 40 and 140 (described in further detail hereinbelow). The VCO 20 is also connected directly to a buffer 80 and then to a second stage 2:1 multiplexer 240. Accordingly, first stage multiplexers 40 and 140 are clocked by c2, i.e. at approximately one-half the frequency generated by VCO 20, and second stage multiplexer 240 is clocked by c1, i.e. at approximately the same frequency generated by VCO 20. The frequency of clock c2 is further divided five-times by a frequency divider 60 to produce a third clock signal c3 of less than approximately 40 Megabits per second (Mbps) for the disclosed 4:1 multiplexer embodiment. This divided frequency clock signal c3 is routed off the inventive multiplexer IC 10 and may be used as a control signal to the VCO 20 to detect and vary the frequency of clock c1.

The four inputs A, B, C and D may by way of example comprise separate photo-electronic signals that first pass through separate lightwave receiver/buffers 30, 130, 230 and 330 which convert a photo-current input to a digital value. Such devices are generally known in the art. The outputs of the plural receiver/buffers are then input to the first stage 2:1 multiplexers 40 and 140 with inputs A and C being connected to multiplexer 40 and inputs B and D to multiplexer 140. Sampling in the 2:1 multiplexers is controlled by clock c2 and the separate input signals are thus sampled at a rate of approximately twice the input signal frequency. The outputs of the first stage 2:1 multiplexers 40, 140 are input to the second stage 2:1 multiplexer 240 and sampled at a rate of approximately four times the input signal frequency, the multiplexer 240 being controlled by clock c1. The second stage 2:1 multiplexer 240 time-division multiplexes the input signals A and C, on the one hand, and B and D, on the other, to form an output signal E preferably in the order of A, B, C, D and at a frequency of approximately c1.

A control signal 100 may also be provided to synchronize the on-chip clock signals, i.e. c1 and c2, with the input signals A, B, C and D. Control signal 100 may be derived from the input signals or manually provided as a general matter of design choice. Alternatively, other art recognized clock recovery and synchronization devices and techniques may be employed to synchronize the various signals being processed by the inventive multiplexer 10 and for optimizing the operation thereof.

To achieve an operating speed in excess of 2 Gbps, the entire design of the inventive multiplexer 10 is most preferably realized using only inverters and pass-gates. These devices require a minimum number of transistors, usually only one or two, and therefore result in a multiplexer that is faster, simpler and less expensive in construction, and that consumes less power than known CMOS multiplexers fabricated using more complex logic devices such, for example as AND and OR gates.

The multiplexer of the present invention may be fabricated using 0.8 $\mu$m pitch linewidth or finer CMOS technology. When fabricated in 0.8 $\mu$m pitch linewidth, a minimum gate delay of approximately 100 ps (picoseconds) is expected. This fact, along with the threestages required to oscillate the VCO 20, and the effects of loading on the VCO 20 all contribute to a frequency of clock c1 in the disclosed 4:1 embodiment of approximately 2.5 Gbps. It will be obvious to a person skilled in the art that the operating speed of the inventive multiplexer 10 increases for finer pitch linewidths.

Figure 2:
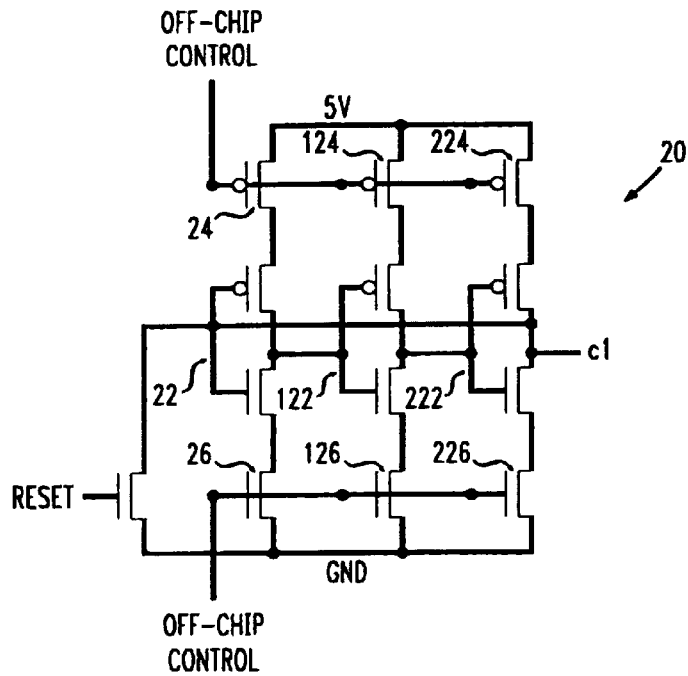
FIG. 2 is a schematic diagram of the voltage controlled oscillator depicted in FIG. 1.

The inventive CMOS multiplexer IC of FIG. 1 will now be described in greater detail with specific reference to FIGS. 2–5. The VCO 20 is schematically depicted in FIG. 2 and comprises three substantially identical parallel stages each respectively having a PMOS-type pass-gate 24, 124, 224, an NMOS-type pass-gate 26, 126, 226, and an inverter 22, 122, 222. The frequency generated by VCO 20 is operatively variable by a DC voltage provided by off-chip electronics which do not form a part of the present invention. In a preferred embodiment, the VCO output frequency ci is approximately four times the frequency of the separate input signals A, B, C and D.

Figure 3:
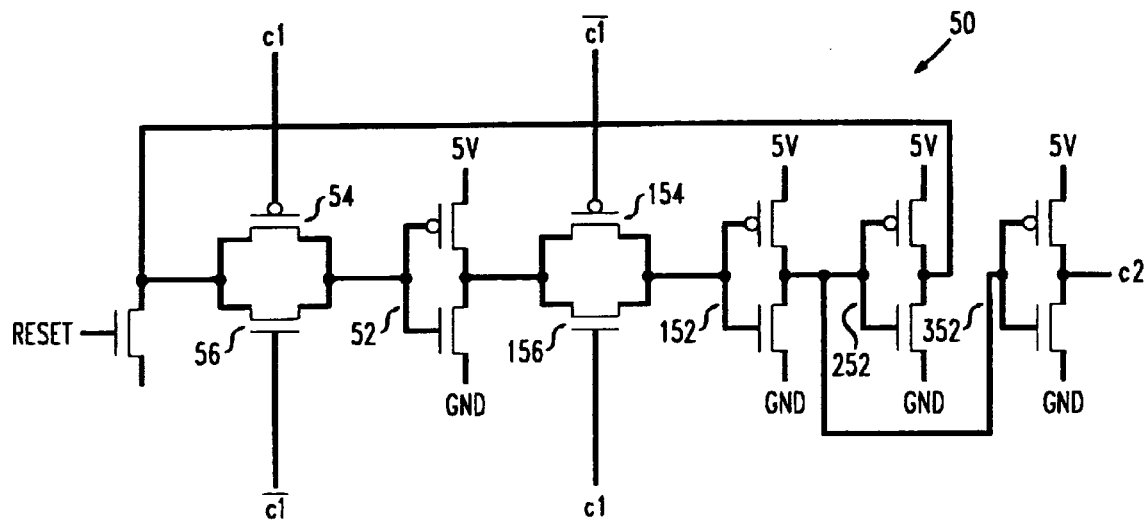
FIG. 3 is a schematic diagram of the ½ frequency divider depicted in FIG. 1.

Referring next to FIG. 3, a CMOS ½ frequency divider 50 constructed in accordance with the present invention is schematically depicted. The frequency divider circuit is effectively a D-latch controlled by the output of VCO 20, i.e. clock ci. The frequency divider 50 comprises a plurality of pass-gates 54, 56, 154, 156 configured as pairs of parallel PMOS- and NMOS-type transistors that are connected in series with a plurality of inverters 52, 152, 252, 352. Clock c1 is connected to PMOS transistor 54 and NMOS transistor 156 and an inverted value of clock c1 is connected to NMOS transistor 56 and PMOS transistor 154 to control the operation of frequency divider 50. Thus, one of the pass-gates in each pair is turned on for each pulse of VCO output c1. This permits a data bit to propagate through the various pass-gates and inverters at a rate that is approximately one-half that of clock c1. In other words, the output signal c2 of frequency divider 50 will change states every two periods of clock c1, thereby dividing the frequency value of cl in half.

Figure 4:
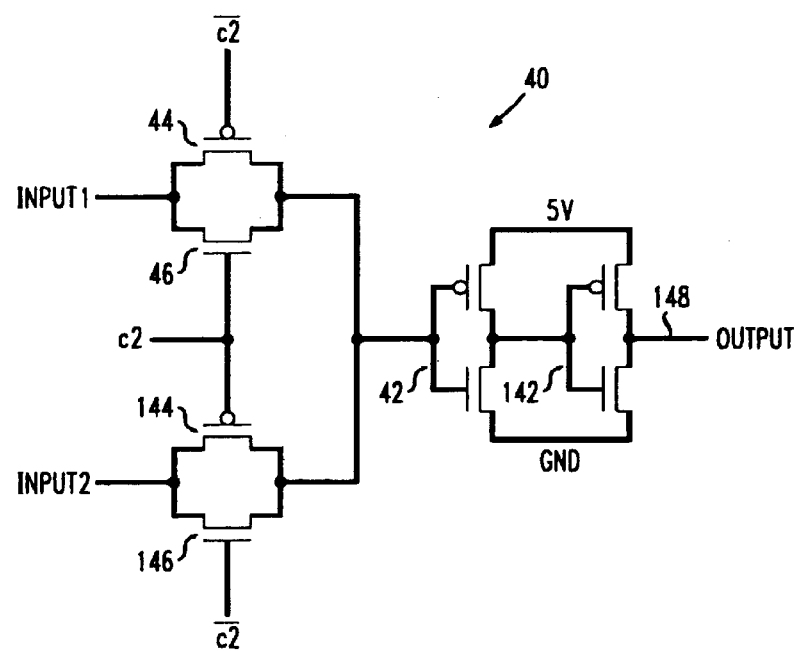
FIG. 4 is a schematic diagram of one of the two-to-one multiplexers depicted in FIG. 1.

Reference is now made to FIG. 4, which depicts a 2:1 multiplexer 40 constructed in accordance with the present invention. It should be understood that the following description of 2:1 multiplexer 40 is typical of each of the 2:1 multiplexers 40, 140, 240 provided in the inventive multiplexer 10 and depicted in FIG. 1, and will not therefore be repeated for each such like device. The multiplexer 40 comprises two separate parallel input stages each having a pair of NMOS- and PMOS-type pass-gates 44 and 46, and 144 and 146. An inverted value of clock c2 is provided at PMOS and NMOS transistors 44, 146, and a non-inverted value of clock c2 is provided at NMOS and PMOS transistors 46, 144. For the second stage 2:1 multiplexer 240, clock cl controls the operation of the pass-gates. One transistor of each input stage will always be active, thereby producing a multiplexed output signal at output 148 having twice the frequency of the individual input signals. Two inverters 42 and 142 are provided as buffers at the output of 2:1 multiplexer 40. In similar fashion, the outputs of the first stage 2:1 multiplexers 40, 140 are provided as inputs to the second stage multiplexer 240—which time-division multiplexes the two input signals as described above. Here, the frequency of the output signal is once again approximately twice the frequency of the individual input signals, i.e. approximately equal to clock c1.

Clocks c1 and c2 may be delayed by a control signal 100 (see FIG. 1) supplied by an adjustable delay circuit before being sent to the first and second stage multiplexers 40, 140, 240. Synchronization of the various on-chip clock signals permits the present invention to optimize the sampling timing of the 2:1 multiplexers and to adjust for any timing mismatches between the inputs A, B, C, D and clocks c1, c2.

A buffer may be provided at the outputs of the various circuits described hereinabove, e.g. VCO 10, frequency divider 50 and 2:1 multiplexers 40, 140, 240. For the herein disclosed 4:1 multiplexer, this buffer will provide a 0.2 nanosecond (ns) rise/fall time for a signal having a 0.4 ns bit period, i.e. for a 2.5 Gbps signal. It will be obvious to a person skilled in the art that this buffer may be selectively tuned to the operating frequency of the inventive IC to provide the required signal conditioning.

Figure 5:
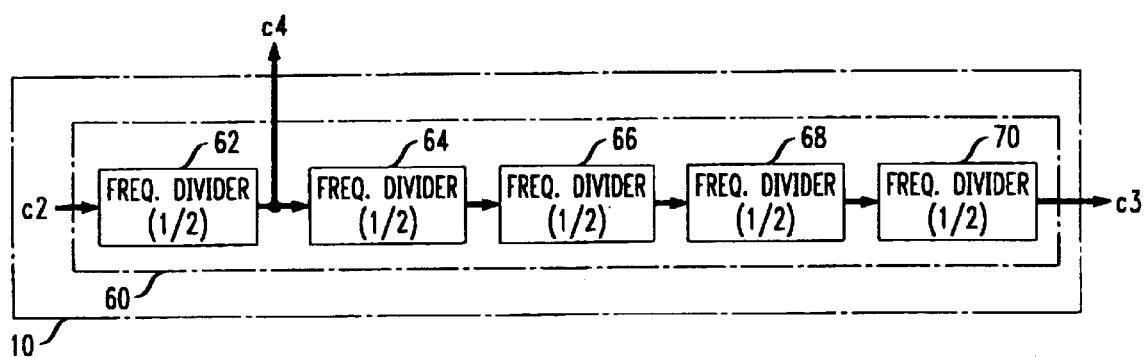
FIG. 5 is a block diagram of the 1/32 frequency divider depicted in FIG. 1.

As shown in FIG. 5, clock c2 may be frequency divided in half five more times by serially connected frequency dividers 62, 64, 66, 68, 70 which are similar to the ½ frequency divider 50 described above. The resulting clocks c4 and c3 after the first and the last dividers 62 and 70, respectively, are routed from the inventive IC 10, i.e. routed off-chip. The first signal c4, which is at approximately the same frequency as the input signals A, B, C and D, may be used to synchronize the inputs and clock c2. The last signal c3, whose frequency is below the electrical pad limits of the inventive multiplexer IC 10, is used to detect the frequency of clock c1, i.e. the frequency of off-chip clock c3 is approximately that of the VCO frequency c1 divided by 64.

Figure 6:
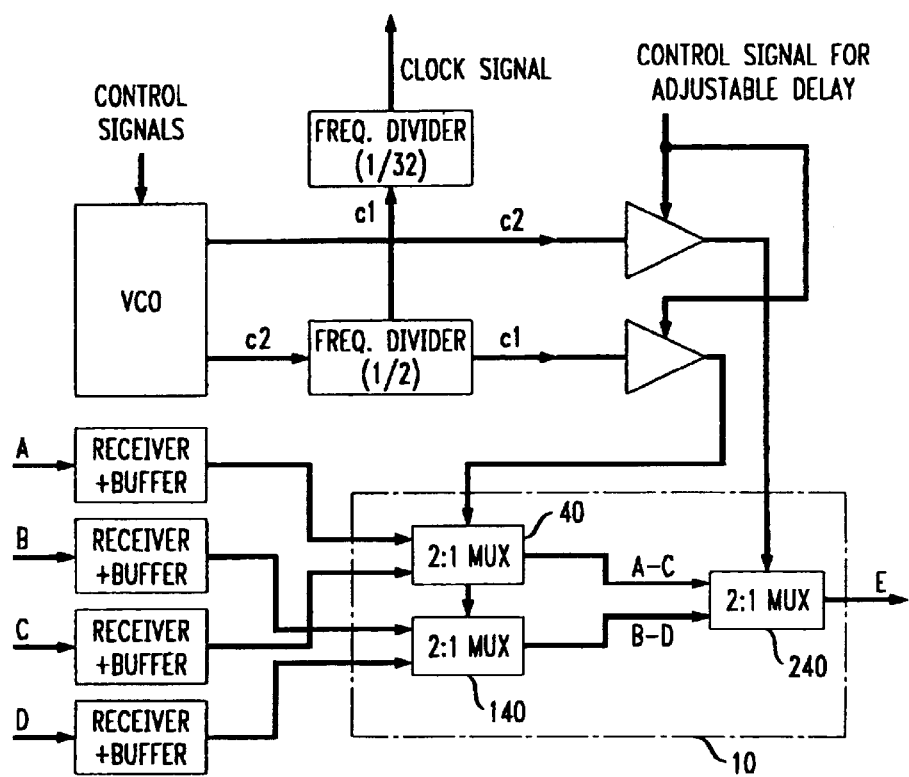
FIG. 6 is an alternative embodiment of a four-to-one CMOS multiplexer constructed in accordance with the present invention.

Referring next to FIG. 6, an alternative embodiment of a multiplexer in accordance with the present invention comprises two stages of 2:1 multiplexers. The remaining clock generating, dividing and synchronizing circuits may be provided by off-chip components and devices. The 2:1 multiplexers of this embodiment may be of substantially the same construction as that depicted in FIG. 4, and their operation will also be substantially like that of the circuit of FIG. 4. Thus, this alternate embodiment of the invention provides a 4:1 CMOS multiplexer that comprises two stages of serially-connected 2:1 multiplexers fabricated solely of pass-gates and inverters.

The inventive multiplexer IC 10 may optimally be further modified to accommodate more or fewer inputs, as long as the sum of the input signal frequencies does not exceed the maximum clock speed ci which is obtained from the VCO 20, i.e the operating speed of the IC 10. It is known that increases in the operating speed of integrated circuits may be obtained by fabricating the devices in finer pitch linewidth technologies. Since the inventive multiplexer may be fabricated in 0.8 $\mu$m pitch linewidth of fine technology, it will be obvious to a person skilled in the art that the operating speed of the inventive multiplexer 10 increases for finer pitch linewidths.

The multiplexer 10 is also well suited for use as a parallel-to-serial optoelectronic interface circuit for high-speed optical interconnects directly to CMOS.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention.

What is claimed is:

1. A time division CMOS multiplexer having input terminals to receive at least two input signals and an output terminal that outputs a multiplexed signal, comprising:
   an integrated circuit comprising:
   CMOS voltage control means for generating a voltage controlled oscillator signal having a frequency;
   CMOS multiplexing means for receiving the oscillator signal having the frequency for multiplexing the at least two input signals and outputting the multiplexed signal, wherein the CMOS multiplexing means consists essentially of inverters and pass gates and
   synchronizing means for synchronizing the voltage controlled oscillator signal and the at least two input signals.

2. The CMOS multiplexer recited in claim 1, the integrated circuit further comprising first CMOS divider means interfaced to the CMOS voltage control means for dividing the frequency of the oscillated signal, to produce a first frequency divided oscillator signal.

3. The CMOS multiplexer recited in claim 2, the integrated circuit further comprising second CMOS divider means interfaced to the first CMOS divider means for generating an off-circuit clock signal having a second frequency divided oscillator signal.

4. The CMOS multiplexer recited in claim 3, the integrated circuit further comprising buffering means for buffering the oscillator signal having the frequency, and the first frequency divided oscillator signal, before the oscillator and first frequency divided oscillator signals are input to the CMOS multiplexing means.

5. The CMOS multiplexer recited in claim 1, wherein the CMOS multiplexing means comprises:
   at least two input buffers that each receive one of the input signals; and
   a first stage multiplexer that multiplexes the input signals.

6. The CMOS multiplexer recited in claim 5, wherein the CMOS multiplexing means further comprises a second stage multiplexer that multiplexes signals received from the first stage multiplexer.

7. The CMOS multiplexer recited in claim 6, wherein the CMOS voltage control means, and the first stage and second stage multiplexers, consist essentially of inverters and pass gates.

8. The CMOS multiplexer recited in claim 2, wherein the CMOS multiplexing means comprises:
   at least two input buffers that each receive one of the input signals;
   a first stage multiplexer that multiplexes the input signals; and
   a second stage multiplexer that multiplexes signals received from the first stage multiplexer,
   and wherein the first stage multiplexer receives the first frequency divided oscillator signal to multiplex the input signals, and the second stage multiplexer receives the oscillator signal having the frequency to multiplex signals received from the first stage multiplexer, and to output the output signal.

9. The CMOS multiplexer recited in claim 8, wherein the CMOS voltage control means, and the first stage and second stage multiplexers, consist essentially of inverters and pass gates.

10. A CMOS multiplexer, comprising:
    a multiplexing integrated circuit comprising:
    a first stage multiplexing circuit adapted to receive a plurality of input signals to produce output multiplexed signals;
    a voltage controlled oscillator that produces an oscillating signal having a first frequency;
    a frequency dividing circuit interfaced to the voltage controlled oscillator for receiving the oscillating signal having the first frequency, and for producing an oscillating signal having a second frequency to control a rate at which the first stage multiplexer performs multiplexing of the input signals;
    a second stage multiplexing circuit interfaced to the first stage multiplexing circuit for receiving the output multiplexed signals from the first stage multiplexing circuit, and for further multiplexing the output multiplexed signals at a rate controlled by the oscillating signal having the first frequency; and
    a delay circuit for synchronizing the oscillating signal and the plurality of input signals,
    wherein the first stage multiplexing circuit, the voltage controlled oscillator, the frequency dividing circuit, and the second stage multiplexing circuit each consist essentially of CMOS inverters and pass gates.

11. The multiplexer recited in claim 10, the integrated circuit further comprising a plurality of input buffers interfaced with the first stage multiplexing circuit in one-to-one correspondence with the plurality of input signals for initially buffering the input signals.

12. The multiplexer recited in claim 10, the integrated circuit further comprising a clock circuit interfaced to the voltage controlled oscillator for producing a clock signal having a clock frequency.

13. A CMOS multiplexer, comprising: a multiplexing integrated circuit comprising:

a voltage controlled oscillator circuit for producing an oscillating signal having a first frequency;

a first frequency dividing circuit interfaced to the voltage controlled oscillator circuit for producing an oscillating signal having a second frequency;

a first stage multiplexing circuit adapted for receiving the oscillating signal having the second frequency, and for multiplexing a plurality of input signals, and consisting essentially of inverters and pass gates;

a first delay circuit for synchronizing the oscillating signal having a first frequency and the plurality of input signals; and a second delay circuit for synchronizing the oscillating signal having a second frequency and the plurality of input signals.

14. The CMOS multiplexer recited in claim 13, tile integrated circuit further comprising a second stage multiplexing circuit for receiving the oscillating signal having the first frequency, and for multiplexing signals received from the first stage multiplexing, circuit.

15. The CMOS multiplexer recited in claim 14, the integrated circuit further comprising a clock circuit interfaced to the voltage controlled oscillator for producing a clock signal having a third frequency.

16. The CMOS multiplexer recited in claim 15, wherein each of said voltage controlled oscillator, first frequency dividing circuit, second stage multiplexing circuit and clock circuit consist essentially of inverters and pass gates.

* * * * *